(12) United States Patent
Rawdanowicz et al.

(10) Patent No.: US 7,803,717 B2
(45) Date of Patent: Sep. 28, 2010

(54) GROWTH AND INTEGRATION OF EPITAXIAL GALLIUM NITRIDE FILMS WITH SILICON-BASED DEVICES

(75) Inventors: Thomas A. Rawdanowicz, Cary, NC (US); Jagdish Narayan, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 1144 days.

(21) Appl. No.: 10/970,773

(22) Filed: Oct. 21, 2004

(65) Prior Publication Data

US 2005/0124161 A1    Jun. 9, 2005

Related U.S. Application Data

(60) Provisional application No. 60/513,791, filed on Oct. 23, 2003.

(51) Int. Cl.
    *H01L 21/31* (2006.01)
(52) U.S. Cl. .................. 438/758; 438/478; 438/543; 257/E21.097; 257/E21.134
(58) Field of Classification Search ............ 438/478, 438/543, 758; 257/E21.097, E21.134
    See application file for complete search history.

(56) References Cited

U.S. PATENT DOCUMENTS

| 5,406,123 | A   |   | 4/1995  | Narayan |
|-----------|-----|---|---------|---------|
| 6,255,198 | B1  |   | 7/2001  | Linthicum et al. |
| 6,391,748 | B1  |   | 5/2002  | Temkin et al. |
| 6,475,923 | B1  | * | 11/2002 | Mitamura .................... 438/758 |
| 6,488,771 | B1  | * | 12/2002 | Powell et al. .................. 117/89 |
| 6,602,764 | B2  |   | 8/2003  | Linthicum et al. |
| 6,956,250 | B2  | * | 10/2005 | Borges et al. ............... 257/189 |
| 2002/0031851 | A1 |   | 3/2002  | Linthicum et al. |
| 2002/0069816 | A1 |   | 6/2002  | Gehrke et al. |
| 2002/0074552 | A1 |   | 6/2002  | Weeks, Jr. et al. |
| 2002/0187356 | A1 |   | 12/2002 | Weeks, Jr. et al. |
| 2002/0197841 | A1 |   | 12/2002 | Nagai et al. |
| 2003/0039866 | A1 | * | 2/2003  | Mitamura .................... 428/698 |

FOREIGN PATENT DOCUMENTS

| EP | 0 864 672 A2   | 9/1998 |
| JP | 11243056       | 9/1999 |
| WO | WO 02/29873 A1 | 4/2002 |

(Continued)

OTHER PUBLICATIONS

Bauer et al., *Reactive Crystal Growth in Two Dimensions: Silicon Nitride on Si(111)*, Physical Review B, vol. 51, No. 24, Jun. 15, 1995, pp. 17891-17901.

(Continued)

*Primary Examiner*—Fernando L Toledo
(74) *Attorney, Agent, or Firm*—Myers Bigel Sibley & Sajovec

(57) ABSTRACT

Epitaxial gallium nitride is grown on a silicon substrate while reducing or suppressing the formation of a buffer layer. The gallium nitride may be grown directly on the silicon substrate, for example using domain epitaxy. Alternatively, less than one complete monolayer of silicon nitride may be formed between the silicon and the gallium nitride. Subsequent to formation of the gallium nitride, an interfacial layer of silicon nitride may be formed between the silicon and the gallium nitride.

15 Claims, 7 Drawing Sheets

FOREIGN PATENT DOCUMENTS

WO     WO 03/006720 A1     1/2003
WO     WO 03/027363 A1     4/2003

OTHER PUBLICATIONS

Borges et al., *Gallium Nitride on Silicon*, Symposium Proceedings, 2001 International Semiconductor Device Research, pp. 382-383.

Calleja et al., *Growth of III-Nitrides on Si(111) by Molecular Beam Epitaxy Doping, Optical, and Electrical Properties*, Journal of Crystal Growth, vol. 201/202, 1999, pp. 296-317.

Cervantes-Contreras et al., *Molecular Beam Epitaxial Growth of GaN on (100)- and (111) Si Substrates Coated With a Thin SiC Layer*, Journal of Crystal Growth, vol. 227-228, 2001, pp. 425-430.

Chen et al., *Growth of High Quality GaN Layers With AlN Buffer on Si(111) Substrates*, Journal of Crystal Growth, vol. 225, 2001, pp. 150-154.

Chen et al., *Structural Study of Chemical Vapor Deposition of Si on GaN*, Proceedings of the 6th International Conference on Solid-State and Integrated Circuit Technology, vol. 2, 2001, pp. 1213-1216.

Dadgar et al., *Reduction of Stress At the Initial Stages of GaN Growth on Si(111)*, Applied Physics Letters, vol. 81, No. 1, Jan. 6, 2003, pp. 28-30.

Follstaedt et al., *Microstructure of GaN Grown on (111) Si by MOCVD*, MRS Internet J. Nitride Semicond. Res., vol. 4S1, 1999.

Hageman et al., *Growth of GaN Epilayers on Si(111) Substrates Using Multiple Buffer Layers*, Mat. Res. Soc. Symp. Proc., vol. 693, 2001, pp. I3.20.1-I3.20.6.

Huang et al., *Comparison of GaN Epitaxial Films on Silicon Nitride Buffer and Si(111)*, Solid-State Electronics, vol. 46, 2001, pp. 1231-1234.

Jeon et al., *Epitaxial Growth of Gallium Nitride by Ion-Beam-Assisted Evaporation*, Thin Solid Films, vol. 270, 1995, pp. 16-21.

Kaiser et al., *Structural Properties of AlGaN/GaN Heterostructures on Si(111) Substrates Suitable for High-Electon Mobility Transistors*, J. Vac. Sci. Technol. B, vol. 18, No. 2, Mar./Apr. 2000, pp. 733-740.

Liu et al., *Wurtzite GaN Epitaxial Growth on Si(111) Using Silicon Nitride as an Initial Layer*, Materials Research Bulletin, vol. 35, 2000, pp. 1837-1842.

Martin et al., *Gallium Nitride Epitaxy on Silicon: Importance of Substrate Preparation*, Mat. Res. Soc. Symp. Proc., vol. 395, 1996, pp. 67-71.

Moustakas et al., *Epitaxial Growth of GaN Films Produced by ECR-Assisted MBE*, Mat. Res. Soc. Symp. Proc., vol. 395, 1996, pp. 111-121.

Munkholm et al., *Layer-by-Layer Growth of GaN Induced by Silicon*, Applied Physics Letters, vol. 77, No. 11, Sep. 11, 2002, pp. 1626-1628.

Nakada et al., *GaN Heteroepitaxial Growth on Silicon Nitride Buffer Layers Formed on Si(111) Surfaces by Plasma-Assisted Molecular Beam Epitaxy*, Applied Physics Letters, vol. 73, No. 6, Aug. 10, 1998, pp. 827-829.

Narayan et al., *Domain Epitaxy: A Unified Paradigm for Thin Film Growth*, Journal of Applied Physics, vol. 93, No. 1, Jan. 1, 1003, pp. 278-285.

Nikishin et al., *High Quality AlN and GaN Grown on Si(111) by Gas Source Molecular Beam Epitaxy With Ammonia*, Mat. Res. Soc. Symp., vol. 595, 2000, pp. W8.3.1-W8.3.6.

Ohtani et al., *Microstructure and Photoluminescence of GaN Grown on Si(111) by Plasma-Assisted Molecular Beam Epitaxy*, Applied Physics Letters, vol. 65, No. 1, Jul. 4, 1994, pp. 61-63.

Ploog et al., *Nucleation and Growth of GaN Layers on GaAs, Si, and SiC Substrates*, J. Vac. Sci. Technol. B, vol. 16, No. 4, Jul./Aug. 1998, pp. 2229-2236.

Sanchez et al., *Origin of Inversion Domains in GaN/AlN/Si(111) Heterostructures Grown by Molecular Beam Epitaxy*, Phys. Stat. Sol. (b), vol. 234, No. 3, 2002, pp. 935-938.

Schenk et al., *Epitaxial Growth of AlN and GaN on Si(111) by Plasma-Assisted Molecular Beam Epitaxy*, Journal of Crystal Growth, vol. 201/202, 1999, pp. 359-364.

Stevens et al., *Growth of Group III Nitrides on Si(111) by Plasma-Assisted Molecular Beam Epitaxy*, J. Vac. Sci. Technol. B, vol. 12, No. 2, Mar./Apr. 1994, pp. 1186-1189.

Tabe et al., *Initial Stages of Nitridation of Si(111) Surfaces: X-Ray Photoelectron Spectroscopy and Scanning Tunneling Microscopy Studies*, Surface Science, vol. 376, 1997, pp. 99-112.

Tamura et al., *GaN Growth on (111) Si With Very Thin Amorphous SiN Layer by ECR Plasma-Assisted MBE*, Superficies y Vacio, vol. 13, Dec. 2001, pp. 80-88.

Venugopal et al., *Influence of the AlN Buffer Layer Growth on AlGaN/GaN Films Deposited on (111)Si Substrates*, 2000 IEEE International Symposium on Compound Semiconductors, pp. 461-466.

Wu et al., *Thermal Nitridation of the Si(111)-7×7 Surface Studied by Scanning Tunneling Microscopy and Spectroscopy*, Physical Review B, vol. 65, 2002, pp. 045309-1-045309-6.

Yodo et al., *Influence of Substrate Nitridation Before Growth on Initial Growth Process of GaN Heteroepitaxial Layers Grown on Si(001) and Si(111) Substrates by ECR-MBE*, Journal of Crystal Growth, vol. 227-228, 2001, pp. 431-436.

"Notification of Transmittal of the International Report and the Written Opinion of the International Searching Authority, or the Declaration", "International Search Report" and "Written Opinion of the International Searching Authority", PCT/US2004/034752, Apr. 21, 2005.

Calleja et al., *Molecular beam epitaxy growth and doping of III-nitrides on Si(111): layer morphology and doping efficiency*, Materials Science and Engineering, vol. B82, 2001, pp. 2-8.

Rawdanowicz et al., *Epitaxial GaN on Si(111): Process control of $SiN_x$ interlayer formation*, Applied Physics Letters, vol. 85, No. 1, Jul. 5, 2004, pp. 133-135.

Vézian et al., *Surface morphology of GaN grown by molecular beam expitaxy*, Materials Science and Engineering, vol. B82, 2001, pp. 56-58.

Wilmott et al., *Growth of GaN(0001) thin films on Si(001) by pulsed reactive cross-beam laser ablation using liquid Ga and $N_2$*, Applied Physics Letters, vol. 73, No. 10, Sep. 7, 1998, pp. 1394-1396.

\* cited by examiner

GROWTH AND INTEGRATION OF EPITAXIAL GALLIUM NITRIDE FILMS WITH SILICON-BASED DEVICES

CROSS REFERENCE TO RELATED APPLICATION

This application claims the benefit of provisional Application No. 60/513,791, filed Oct. 23, 2003, entitled Growth and Integration of Epitaxial Gallium Nitride Films With Silicon-Based Devices, the disclosure of which is hereby incorporated herein by reference in its entirety as if set forth fully herein.

FEDERALLY SPONSORED RESEARCH

This invention was made at least in part with Government support under National Science Foundation Contract No. 5-39207. The Government may have certain rights to this invention.

FIELD OF THE INVENTION

This invention relates to semiconductor structures and fabrication methods, and more particularly to gallium nitride semiconductor structures and fabrication methods therefor.

BACKGROUND OF THE INVENTION

This invention relates to heteroepitaxial growth of gallium nitride (GaN) thin films on silicon (Si) substrates. Conventionally, a buffer layer is used between the GaN and the Si to compensate, at least in part, for the lattice mismatch between Si and GaN. The buffer layer conventionally comprises aluminum nitride (AlN) and/or silicon nitride (SiN).

SUMMARY OF THE INVENTION

Some embodiments of the present invention grow epitaxial GaN while reducing or suppressing the formation of a buffer layer. In some embodiments, the GaN is grown directly on the Si. In other embodiments, domain epitaxy, as described, for example, in U.S. Pat. No. 5,406,123, may be used to grow the GaN directly on the Si. In some embodiments, less than one complete monolayer of SiN is formed between the Si and the GaN. In other embodiments, subsequent to formation of the GaN, an interfacial layer of SiN may be formed between the Si and the GaN.

DETAILED DESCRIPTION

Figure 1:
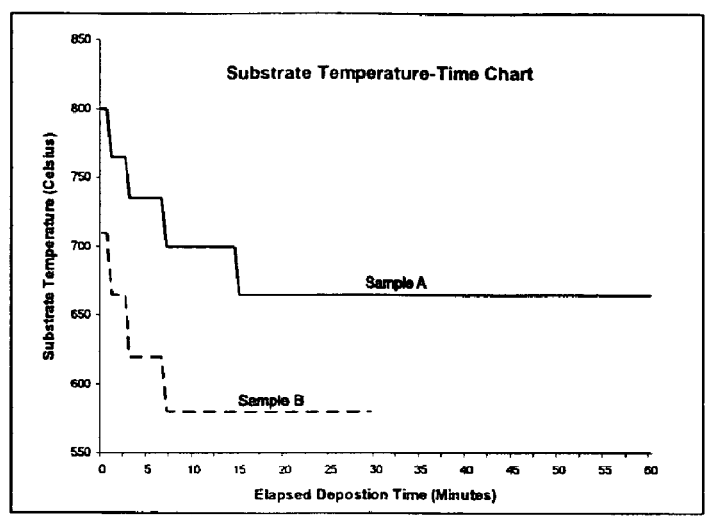
FIG. 1 is a deposition Temperature-Time chart for both GaN/Si(111) samples, A and B.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. In contrast, the term "directly" means that there are no intervening elements.

Figure 7:
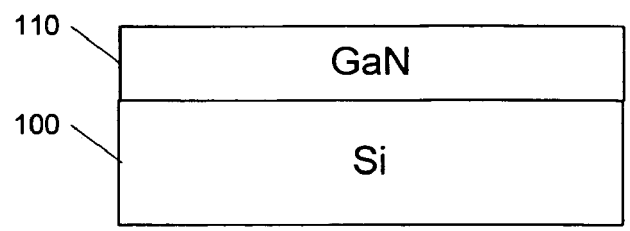
FIGS. 7-9 are cross-sectional views of embodiments of the present invention.
Figure 8:
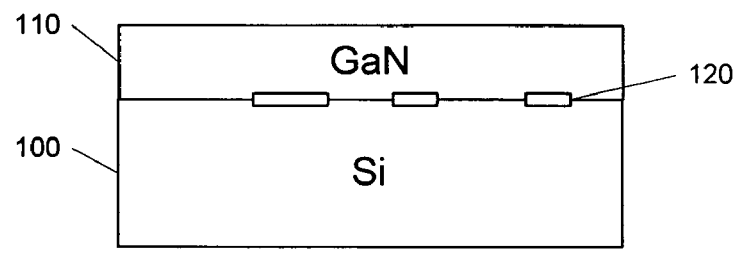
Figure 9:
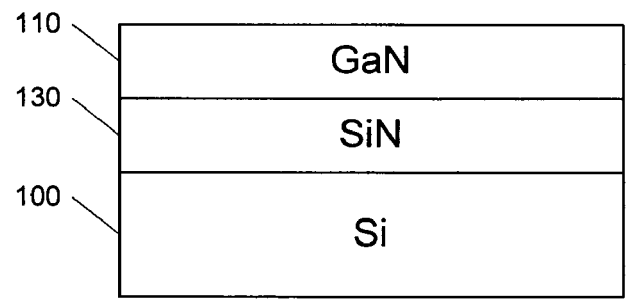

FIGS. 7-9 are cross-sectional views of microelectronic structures that may be fabricated according to some embodiments of the present invention using fabrication methods according to some embodiments of the present invention. As shown in FIG. 7, a silicon substrate 100, for example a (111) silicon substrate, is provided. Techniques for fabricating silicon substrates are well known to those having skill in the art and need not be described further herein. As also shown in FIG. 7, a GaN thin film 110, such as a single crystal wurtzite GaN thin film, is formed directly on the silicon substrate 100. In some embodiments, domain epitaxy, as described, for example, in U.S. Pat. No. 5,406,123, the disclosure of which is hereby incorporated herein by reference in its entirety as if set forth fully herein, may be used to grow the GaN directly on the Si 100.

As shown in FIG. 8, in some embodiments, less than one complete monolayer 120 of SiN is formed between the Si and the GaN prior to and/or subsequent to the growth of the GaN thin film 110. As shown in FIG. 9, in other embodiments of the present invention, subsequent to the formation of the GaN layer 110 according to, for example, embodiments of FIGS. 7 and/or 8, an interfacial layer of SiN 130 may be formed between the Si 100 and the GaN 110.

FIGS. 7-9 also describe structures according to embodiments of the present invention wherein a GaN thin film 110 is directly on a silicon substrate 100 (FIG. 7), or less than one monolayer of SiN 120 is provided between a thin film layer of GaN 110 and a silicon substrate 100.

Additional theoretical and empirical discussion of various embodiments of the present invention now will be provided.

There is considerable interest in the growth of III-nitride such as gallium nitride based thin film heterostructures on silicon substrates, for example, from considerations of cost effectiveness and integration of GaN optoelectronic devices with silicon based microelectronics. GaN with a wurtzite structure (a=0.3189 nm; c=0.5185 nm) has a large misfit (close to 17%) with silicon (a=0.543 nm), but single-crystal thin films can be grown, according to some embodiments of the invention, using domain matching epitaxy on Si(111) via matching of integral multiple lattice planes across the film-substrate interface. Domain matching epitaxy is described in Narayan et al., *Domain Epitaxy: A Unified Paradigm for Thin Film Growth*, Journal of Applied Physics, Vol. 93, No. 1, Jan. 1, 2003, pp. 278-285, and U.S. Pat. No. 5,406,123 to Narayan, entitled Single Crystal Titanium Nitride Epitaxial on Silicon, issued Apr. 11, 1995. In some embodiments of the invention, since the critical thickness for such a large misfit is close to a monolayer, the dislocations can set from the beginning and the rest of the film can grow relaxed (strain-free). The critical thickness is defined as the film thickness at which it becomes energetically favorable for the film to contain dislocations. Additionally, in some embodiments of the invention, these dislocations can be confined to the interface region and can stay away from the active regions of the devices. This can be accomplished by a two-dimensional growth during initial stages so that dislocation can exit to the edge of the wafers. Two-dimensional growth is also described in the above-cited Narayan publication and the '123 patent.

An intermediate $SiN_x$ layer forming when attempting to grow epitaxial GaN directly on silicon at optimum GaN growth temperatures in the regime of about 600 to about 700° C. has been reported as a serious impediment to the heteroepitaxial growth of GaN directly on Si, as well as reported desirable or necessary for the successful growth of epitaxial GaN for controlled $SiN_x$ nucleation and growth. Previous studies have focused on the formation of silicon nitride layer as an intermediate buffer between GaN and silicon. See for example, Nakada et al., Appl. Phys. Lett., 73, 827 (1998); Yodo et al., J. Crystal Growth, 227/228, 431 (2001); Huang et al., Solid State Electron., 46, 1231 (2002); Wu et al., Phys. Rev. B, 65, 045309-1 (2002); Tabe et al., Surf. Sci., 376, 99 (1997); Bauer et al., Phys. Rev. B, 51, 17891 (1995); Chen et al., J. Crystal Growth, 225, 150 (2000); and Shenk et al., J. Crystal Growth, 201/202, 359 (1999). These studies have noted that the formation of a thin crystalline silicon nitride interlayer may be necessary to obtain epitaxial growth of α-GaN on Si(111). Some embodiments of the invention may arise from a recognition that, since silicon nitride is usually amorphous, an epitaxial crystalline GaN layer should not grow on the top of amorphous $SiN_x$. The above-mentioned studies appear to have speculated the formation of one to two monolayers of crystalline silicon nitride (Wu et al. publication) or the presence of pinholes in amorphous silicon nitride.

In contrast, according to some embodiments of the present invention, the formation of a crystalline silicon nitride interlayer is not used for the GaN epitaxy on Si(111) (FIG. 7). In some embodiments of the invention, by restricting the nitriding (<1 monolayer as shown in FIG. 8) of the silicon surface to that level which reduces the interfacial energy, the (0001) GaN can grow epitaxially on Si(111) directly via domain matching epitaxy where integral multiples (⅘ and ⅚) of lattice planes of GaN match with silicon planes. In some embodiments of the invention (FIG. 9), the formation of amorphous $SiN_x$ results from a subsequent diffusion of nitrogen to the GaN/Si interface, while maintaining the single crystal nature of top GaN layers.

EXAMPLES

The following examples shall be regarded as merely illustrative and shall not be construed as limiting the invention.

Si(111) substrates were P-doped, n-type with p≈7.5 Ω-cm with the surface misoriented a nominal 2.5°. The Si substrates were wet etched (60 s) using buffered hydrofluoric acid. The in situ RHEED measurements confirmed (7×7) surface reconstruction of clean Si(111) surfaces prior to deposition at initial deposition temperatures. The Si substrates were directly heated (e.g., radiant heated) for rapid and variable control of the substrate temperature as a function of elapsed deposition time. The substrate temperature-time charts, in FIG. 1, were designed to initiate and then limit S—N reaction at the Si surface. Si substrate temperatures were measured using an infrared pyrometer to within ±20° C. accuracy (absolute).

The GaN thin films were deposited in an ultra-high-vacuum (UHV) Laser-MBE chamber using a KrF excimer laser ablating a solid source GaN target of 99.99% purity. The chamber deposition parameters were as follows: base pressure—$4 \times 10^{-9}$ Torr, laser pulse rate—10 to 12 Hz, laser radiation wavelength—248 nm and pulse width—25 nsec, laser pulse energy (exit port)—650 mJ, and spot size—1.8 × 2.8±0.2 mm.

Microstructural characterization and interface analysis of the deposited thin films was performed by HRTEM using a JEOL-2010F analytical electron microscope. High-resolution Z-contrast imaging was performed in the STEM mode coupled with elemental Ga and N composition analysis using EELS.

Fast Fourier Transformation processing of HRTEM GaN/Si interface images were employed to investigate the lattice matching relation of the epitaxial GaN epilayer and Si substrate for nearly abrupt interfaces.

Figure 2:
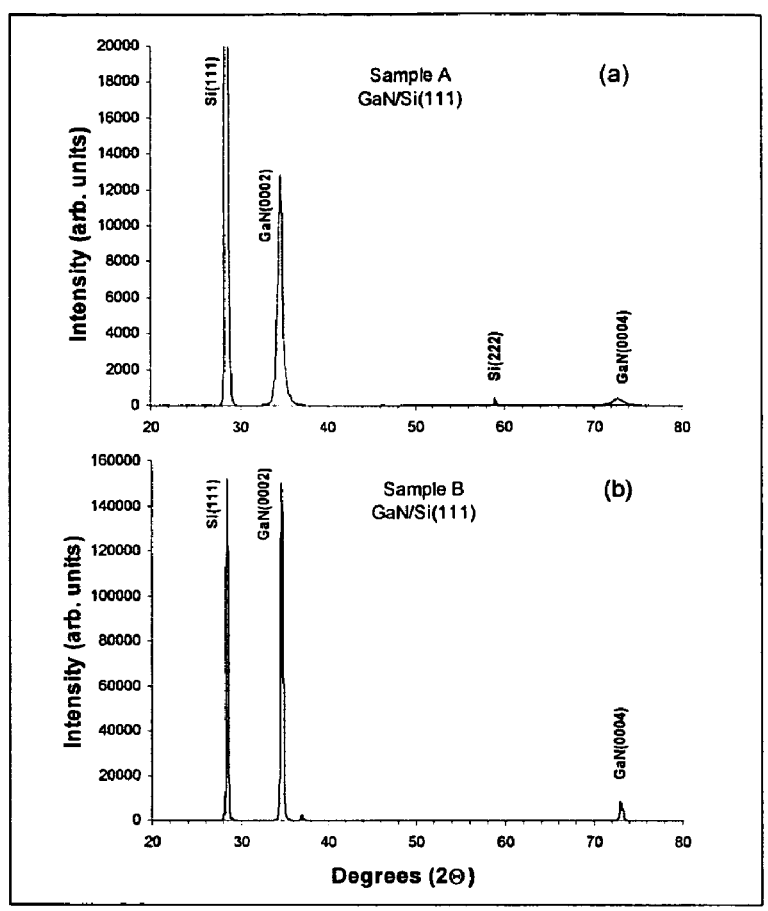
FIG. 2 is a graph of X-ray diffraction intensity vs. incident angle for (a) GaN/Si(111) sample A and (b) GaN/Si(111) sample B.

The epitaxial GaN deposition results for two different substrate thermal conditions (sample A and B) are listed in Table I. The x-ray diffraction "Θ-2Θ" scans, in FIG. 2, show narrow and intense GaN (0002) reflections at 2Θ=34.6° indicating the epitaxial GaN thin films to be highly oriented along the [0001] direction for GaN films in both samples, A and B. The XRD peak amplitude and width for sample B, in FIG. 2 and tabulated in Table I, show an improved crystal structure (compared to sample A) for the GaN/Si interfacial reaction restricted to less than half of a monolayer. The steady state substrate temperature was set at 580° C. for GaN heteroepitaxial thin film growth.

The selected-area-electron-diffraction patterns (SAED) of the <110> cross-sections of both samples confirm that epitaxial growth occurred for both depositions. In both instances, the GaN epilayer orientation to the Si(111) substrate is GaN $[0002]\|Si[111]$, $GaN[2\bar{1}\bar{1}0]\|Si[\bar{1}10]$ and $GaN[01\bar{1}0]\|Si[\bar{2}11]$.

TABLE I

Experimental conditions and results for the deposition of epitaxial GaN on Si(111) substrates.

| Sample | Steady State $T_{substrate}$ °C. | Deposit Time (min.) | Total Pulses | Film Thickness (nm) | Growth Rate (Å/s) | XRD FWHM (arcmin.) |
|---|---|---|---|---|---|---|
| A | 665 | 60 | 36,000 | 300 | 0.83 | 31 |
| B | 580 | 30 | 21,600 | 500 | 2.77 | 18 |

Figure 3:
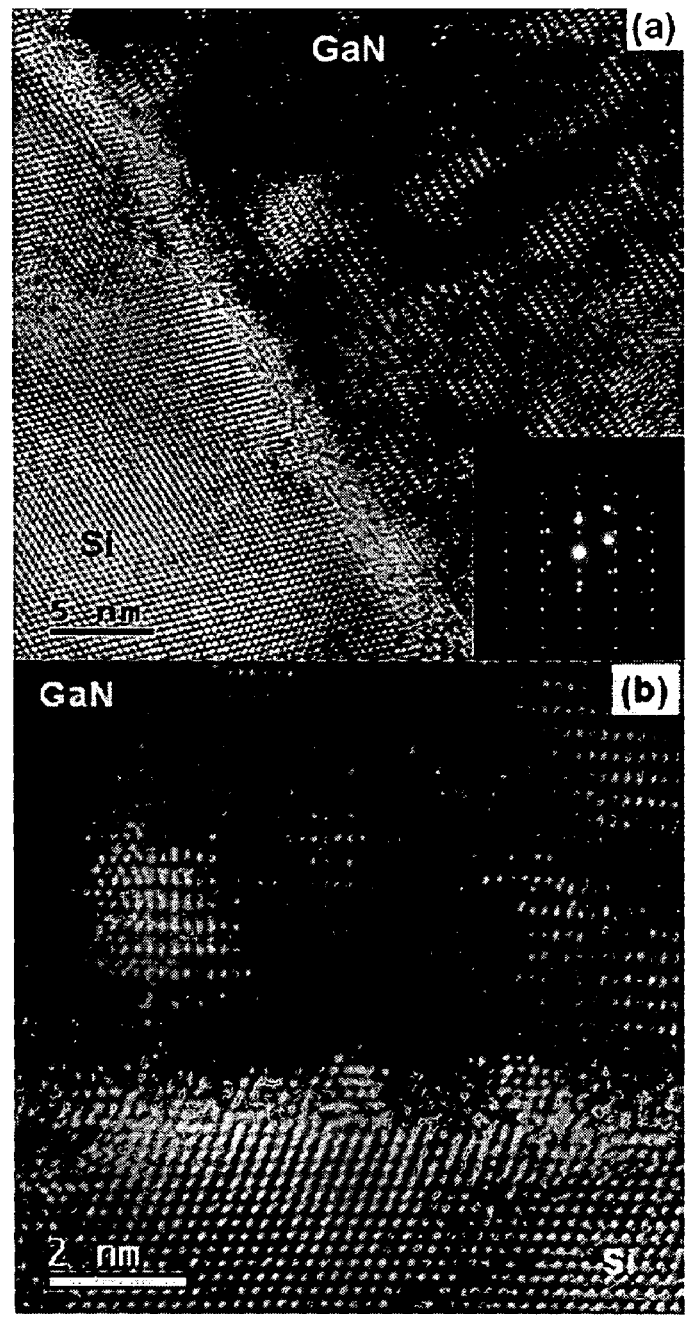
FIG. 3 illustrates cross-section HRTEM images of GaN/Si (111) sample A viewed from Si<110> zone axis with (a) inset of SAED pattern and (b) high magnification image of interface.

The HRTEM results from sample A at two different magnifications are shown in FIGS. 3(a) and 3(b), where cross-section electron micrographs show the details of GaN epitaxy and the nature of GaN/Si(111) interface. The HRTEM image from the <110> cross-section at a higher magnification in FIG. 3(b) clearly shows the GaN epilayer with an interface that appears to include $SiN_x$ formed as layers ranging in thickness from sub-monolayer to about four layers. Some amorphous-like areas were observed to be present at the interface region. However, the occurrence was predominantly near the thinnest region of the TEM specimen, suggesting disordering may be due to the effects of the 200 keV electron beam.

Figure 4:
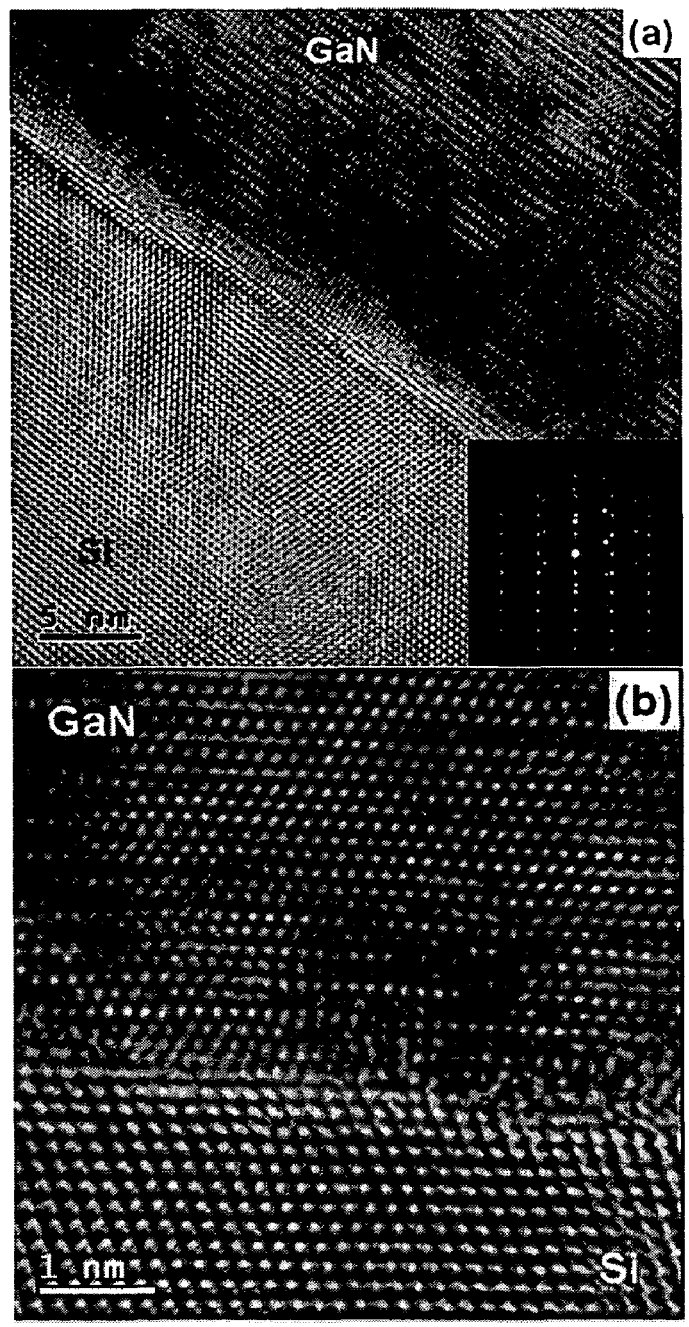
FIG. 4 illustrates cross-section HRTEM images of GaN/Si (111) sample B viewed from Si<110> zone axis with (a) inset of SAED pattern and (b) high magnification image of interface.

The temperature profile for sample B was selected to further limit Si—N bond formations to less than half of a monolayer in order to form a nearly abrupt interface, as shown in HRTEM cross-section micrographs of FIGS. 4(a) and (b). An objective was to enhance two-dimensional growth of GaN by reducing the surface diffusion barriers through wetting the Si surface via limited Si—N bond formations, i.e., reduce interfacial energies. The substrate temperature for the first few monolayers is sufficiently high for N desorption to create a Ga-rich growing layer. The available Si dangling bonds for Si—N bond formation captures the remaining and less mobile N adatoms. This partial sub-monolayer nitridation improves the surface mobility of newly arriving N adatoms for the successful growth of heteroepitaxial growth of GaN on Si(111) via domain matching epitaxy. FIG. 4(a) shows a high-resolution cross-section TEM micrograph with a diffraction pattern (inset), which is consistent with the above epitaxial relationship between the film and the substrate.

At a higher magnification, the HRTEM image from the <110> cross-section for sample B shows no amorphous layer and a direct transition from GaN into the Si, as shown in FIG. 4(b). The transition from Si to GaN is nearly abrupt on the step plateaus (terraces) compared to initial Si—N reaction observed at the step edges (FIG. 4(b)). The GaN epilayer in FIG. 4(b) is inclined about 2.5° with respect to the (111) Si plane and coincident with the vicinal Si surface.

Figure 5:
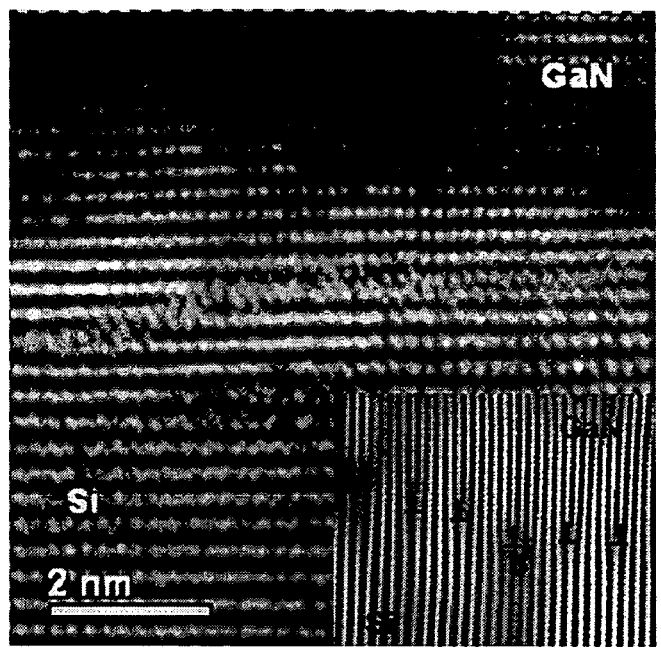
FIG. 5 illustrates HRTEM image of GaNSi(111) sample B cross-section viewed from Si<211> zone axis with inset of Fourier filtered image showing a predominantly 6:5 DME ratio between GaN and Si(111).

In order to investigate the epitaxial relation of GaN[2$\bar{1}$$\bar{1}$0]||Si[$\bar{1}$10], high resolution images of GaN/Si cross-section of sample B, in FIG. 5(a), from <422> Si zone axis were obtained. The inset in FIG. 5 shows the corresponding filtered FFT image with one set of GaN (2$\bar{1}$$\bar{1}$0) and Si(110) diffractions masked and the resulting Fourier filtered image. The magnified Fourier filtered image shows clear domain matching relation of GaN and Si. The matching generally follows 6 to 5 ratio with probable GaN misfit dislocation, marked as ⊥, generated in each domain. Domain matching epitaxy (DME) in GaN/Si may use a 5 to 6 ratio between Si and GaN interplanar distances. This matching of integral multiples of lattice planes provides for a lattice misfit of about 0.34% given by $\epsilon_r = md_f/nd_s - 1$.

This DME provides a mechanism for epitaxial growth in the GaN/Si system with large lattice misfit by at least partially relieving the strain within a couple of monolayers. The pseudomorphic GaN/Si interface of abrupt regions were predominantly located at the terraces interlaced with regions of initial nucleation of $SiN_x$ in the immediate vicinity of the step edges averaging approximately every 7 nm, defined by the inclined surface of the Si(111) substrate. In agreement with reported work, the silicon nitride islands appeared to preferentially nucleate at the step edges during initial exposure to dissociate nitrogen at elevated substrate temperatures (~700 to ~800+° C.). See, for example, the above-cited Tabe et al. and Bauer et al. publications. Although the DME system has been demonstrated to be geometrically feasible, it is suggested that sub-monolayer Si—N bonds at the Si(111) surface allows sufficient passivation of Si dangling bonds to reduce overall Si surface energy to promote two-dimensional growth. From these results, it appears that the formation of $SiN_x$ is not necessary for epitaxial growth of GaN on a Si(111) substrate.

Figure 6:
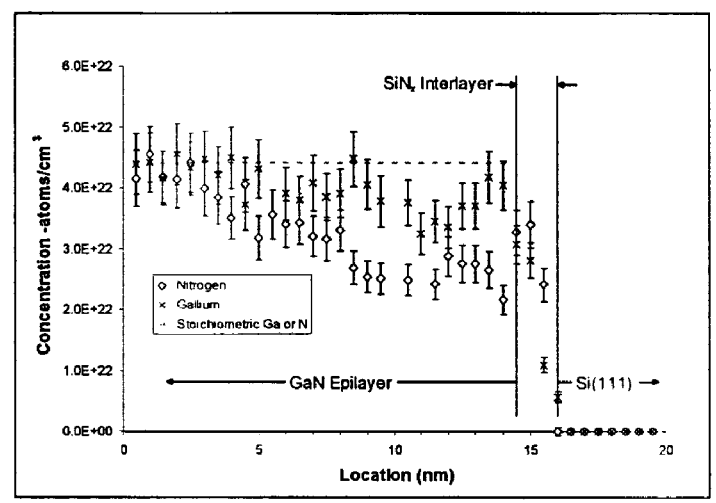
FIG. 6 is an EELS line scan of GaN/Si interface.

Line-scan EELS analysis showing distribution of Ga and N atom concentrations for the first 14 nm of GaN epilayer coincident with the first 3 minutes of deposition is plotted in FIG. 6. The elemental ratio of Ga to N converges to a one-to-one stoichiometry after the first 3 minutes of an 800° C. substrate temperature is concluded. The $SiN_x$/Si(111) interface was precisely determined from trace amounts of $O_2$ detected in the EELS spectrum.

The EELS analysis at the center of the interlayer region yielded an Si/N elemental ratio of 0.28±0.048 with the Si atom concentration measured at about $3.7 \times 10^{21}$ atoms/cm$^3$ and N at $2.3 \times 10^{22}$ atoms/cm$^3$ indicating the $SiN_x$ interlayer composition to be sub-stoichiometric to the Si/N ratio of 0.75 for $Si_3N_4$. Thus, during high-temperature growth in the temperature range of 800° C., nitrogen diffuses to the GaN/Si interface and forms amorphous $SiN_x$. However, note that the formation of amorphous $SiN_x$ occurs after GaN epitaxy has already been set on the Si(111) substrate.

Accordingly, some embodiments of the present invention grow epitaxial GaN directly on silicon via, in some embodiments, domain matching epitaxy. In some embodiments of the present invention, the Si—N formation may be limited to the role of a surfactant to lower the N surface diffusion barrier to achieve high quality heteroepitaxial GaN thin films directly on Si(111) without the necessity of an intentionally grown $SiN_x$ buffer layer. Thus, in some embodiments, the surface diffusion process, which may be a factor in determining the nucleation behavior, is manipulated by the dynamic control of the substrate temperature, which then subsequently permits domain matching epitaxy of GaN on a Si(111) template.

The epitaxial relationship of GaN on Si(111), both with and without a $SiN_x$ interlayer, may be revealed as [0002]||Si[111], [2$\bar{1}$$\bar{1}$0]||Si[$\bar{1}$10], and [01$\bar{1}$0]||Si[$\bar{2}$11]. A DME of 5:6 ratio between the interplanar distance of Si (110) and GaN (2$\bar{1}$$\bar{1}$0) may be observed for clean interfaces along terraces of the Si(111) surface.

In some embodiments, the formation of amorphous silicon nitride ($SiN_x$) occurs as a result of subsequent nitrogen diffusion to the GaN/Si(111) interface, which appears to explain why the GaN epitaxy is maintained above an amorphous layer.

In conclusion, in some embodiments of the present invention, single wurtzite GaN thin films are heteroepitaxially grown directly on (111) Si by laser-molecular-beam-epitaxy using dynamic temperature control of the Si substrate to limit $SiN_x$ formation at the GaN/Si interface. Epitaxial (0001) GaN can be grown directly on Si(111) without the need for a $SiN_x$ buffer layer. In some embodiments of the present invention, $SiN_x$ can be formed subsequently as a result of nitrogen diffusion to the GaN/Si(111) interface. The orientation-relationship of GaN on Si(111) was determined using X-ray diffraction and selected area diffraction of the Si<110> and <112> zone axes. The atomic structure of the interfaces were studied by HRTEM from both Si<110> and <112> zone axes. Fourier filtered images of cross-sectional GaN/Si(111) of the nearly abrupt GaN/Si interface demonstrated domain matching epitaxy of 5:6 ratio. The EELS (electron energy loss spectroscopy) analysis was used to determine N and Ga concentration as a function of distance from the GaN/Si interface. This analysis showed a deficit of nitrogen near the interface, which diffused to the interface to create amorphous $SiN_x$ interposing layer.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a gallium nitride thin film comprising:

heteroepitaxially growing a gallium nitride single-crystal thin film directly on a silicon substrate, wherein heteroepitaxially growing comprises heteroepitaxially growing a gallium nitride single-crystal thin film directly on a silicon substrate using domain epitaxy wherein integral multiples of lattice planes of the gallium nitride single-crystal thin film match with planes of the silicon substrate.

2. A method according to claim 1 wherein heteroepitaxially growing comprises heteroepitaxially growing a gallium nitride single-crystal thin film directly on a silicon substrate using domain epitaxy.

3. A method according to claim 1 wherein heteroepitaxially growing comprises heteroepitaxially growing a gallium nitride single-crystal thin film directly on a silicon substrate while forming less than one complete monolayer of silicon nitride therebetween.

4. A method according to claim 2 wherein heteroepitaxially growing comprises heteroepitaxially growing a gallium nitride single-crystal thin film directly on a silicon substrate using domain epitaxy while forming less than one complete monolayer of silicon nitride therebetween.

5. A method according to claim 1 wherein heteroepitaxially growing is followed by:
    forming a layer comprising silicon nitride between the silicon substrate and the gallium nitride single-crystal thin film that was heteroepitaxially grown directly on the silicon substrate.

6. A method according to claim 4 wherein heteroepitaxially growing is followed by:
    forming a layer comprising silicon nitride between the silicon substrate and the gallium nitride single-crystal thin film that was heteroepitaxially grown directly on the silicon substrate.

7. A method according to claim 1 wherein the silicon substrate is a (111) silicon substrate and wherein the gallium nitride single-crystal thin film has a wurtzite structure.

8. A method according to claim 1 wherein integral multiples of lattice planes of the gallium nitride single-crystal thin film match with planes of the silicon substrate in a ratio of 4:5 or 5:6.

9. A method according to claim 8 wherein an orientation of the gallium nitride single-crystal thin film to the (111) silicon substrate is defined by:
    GaN[0002]∥Si[111], GaN[2$\bar{1}\bar{1}$0]∥Si[$\bar{1}$10] and GaN[01$\bar{1}$0]∥Si[$\bar{2}$11].

10. A method of fabricating a gallium nitride thin film comprising:
    domain epitaxially growing a gallium nitride single-crystal thin film on a silicon substrate wherein domain epitaxially growing comprises matching integral multiples of lattice planes of the gallium nitride single-crystal thin film with planes of the silicon substrate.

11. A method according to claim 10 wherein domain epitaxially growing comprises domain epitaxially growing a gallium nitride single-crystal thin film on a silicon substrate while forming less than one complete monolayer of silicon nitride therebetween.

12. A method according to claim 10 wherein domain epitaxially growing is followed by:
    forming a layer comprising silicon nitride between the silicon substrate and the gallium nitride single-crystal thin film that was domain epitaxially grown on the silicon substrate.

13. A method according to claim 10 wherein the silicon substrate is a (111) silicon substrate and wherein the gallium nitride single-crystal thin film has a wurtzite structure.

14. A method according to claim 10 wherein integral multiples of lattice planes of the gallium nitride single-crystal thin film match with planes of the silicon substrate in a ratio of 4:5 or 5:6.

15. A method according to claim 14 wherein an orientation of the gallium nitride single-crystal thin film to the (111) silicon substrate is defined by:
    GaN[0002]∥Si[111], GaN[2$\bar{1}\bar{1}$0]∥Si[$\bar{1}$10] and GaN[01$\bar{1}$0]∥Si[$\bar{2}$11].

* * * * *

UNITED STATES PATENT AND TRADEMARK OFFICE
CERTIFICATE OF CORRECTION

| | | |
|---|---|---|
| PATENT NO. | : 7,803,717 B2 | Page 1 of 1 |
| APPLICATION NO. | : 10/970773 | |
| DATED | : September 28, 2010 | |
| INVENTOR(S) | : Rawdanowicz et al. | |

It is certified that error appears in the above-identified patent and that said Letters Patent is hereby corrected as shown below:

In the Specification:
Column 1, Federally Sponsored Research, Lines 17-20,:

Please replace this section in its entirety with the following:

-- This invention was made with Government support under grant number 9706680 awarded by the National Science Foundation. The Government has certain rights in the invention. --

Signed and Sealed this
Twenty-fifth Day of February, 2014

Michelle K. Lee
*Deputy Director of the United States Patent and Trademark Office*